United States Patent
Yang et al.

(10) Patent No.: US 8,868,022 B2
(45) Date of Patent: Oct. 21, 2014

(54) BROADBAND TRANSCONDUCTANCE AMPLIFIER

(75) Inventors: Dong-Jun Yang, Chandler, AZ (US); Mohammed Shah Alam, Chandler, AZ (US)

(73) Assignee: Intel IP Corporation, Santa Clara, CA (US)

( * ) Notice: Subject to any disclaimer, the term of this patent is extended or adjusted under 35 U.S.C. 154(b) by 212 days.

(21) Appl. No.: 13/450,570

(22) Filed: Apr. 19, 2012

(65) Prior Publication Data

US 2013/0278342 A1    Oct. 24, 2013

(51) Int. Cl.
*H04B 1/28* (2006.01)
*H04B 1/16* (2006.01)
*H03F 3/195* (2006.01)
*H03G 1/00* (2006.01)

(52) U.S. Cl.
CPC ............. *H03F 3/195* (2013.01); *H03G 1/0094* (2013.01)
USPC .......................................... 455/333; 455/341

(58) Field of Classification Search
CPC . H03F 3/195; H03F 2200/294; H03G 1/0094; H03G 3/008
USPC ................................................... 455/333, 341
See application file for complete search history.

(56) References Cited

U.S. PATENT DOCUMENTS

| | | | |
|---|---|---|---|
| 7,110,742 B2* | 9/2006 | Roufoogaran | 455/333 |
| 7,495,515 B1* | 2/2009 | Branch et al. | 330/305 |
| 7,592,873 B2* | 9/2009 | Satoh et al. | 330/305 |
| 8,008,973 B2* | 8/2011 | Fujimoto | 330/283 |
| 8,306,494 B2* | 11/2012 | Ojo | 455/248.1 |

OTHER PUBLICATIONS

Vidojkovic et al.; "Fully-Integrated Dect/Bluetooth Multi-Band LNA in 0.18 μm CMOS"; ISCAS 2004; pp. 4.

* cited by examiner

*Primary Examiner* — Simon Nguyen
(74) *Attorney, Agent, or Firm* — Baker Botts L.L.P.

(57) ABSTRACT

A transconductance amplifier having an input terminal for receiving an input signal and an output terminal for communicating an output signal based on the input signal, the transconductance amplifier may include a gain transistor and a variable capacitance. The gain transistor may have a gate terminal, a first non-gate terminal, and a second non-gate terminal, the first non-gate terminal coupled to the output terminal of the transconductance amplifier. The variable capacitance may be coupled between the gate terminal of the gain transistor and the second non-gate terminal of the gain transistor.

17 Claims, 7 Drawing Sheets

BROADBAND TRANSCONDUCTANCE AMPLIFIER

TECHNICAL FIELD

The present disclosure relates generally to wireless communication and, more particularly, to broadband transconductance amplifiers.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

A receiver in a wireless communication device may employ a low-noise amplifier (LNA) to amplify a radio-frequency (RF) signal received by the receiver. In many instances, an LNA may be implemented as a broadband transconductance amplifier (TCA), configured to amplify RF signals over a wide range of frequencies. In traditional broadband TCA implementations, an input impedance magnitude of the broadband TCA ($R_P$) and a quality factor (Q) associated with the input impendance may be relatively high at lower operating frequencies, but low for higher operating frequencies. Thus, for broadband operations at a wide range of frequencies, the gain and noise figure (defined as the ratio of the signal-to-noise ratio at the input of the broadband TCA to the signal-to-noise ratio at the output of the broadband TCA) may vary significantly over the wide range of frequencies.

SUMMARY

A transconductance amplifier having an input terminal for receiving an input signal and an output terminal for communicating an output signal based on the input signal, the transconductance amplifier may include a gain transistor and a variable capacitance. The gain transistor may have a gate terminal, a first non-gate terminal, and a second non-gate terminal, the first non-gate terminal coupled to the output terminal of the transconductance amplifier. The variable capacitance may be coupled between the gate terminal of the gain transistor and the second non-gate terminal of the gain transistor.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
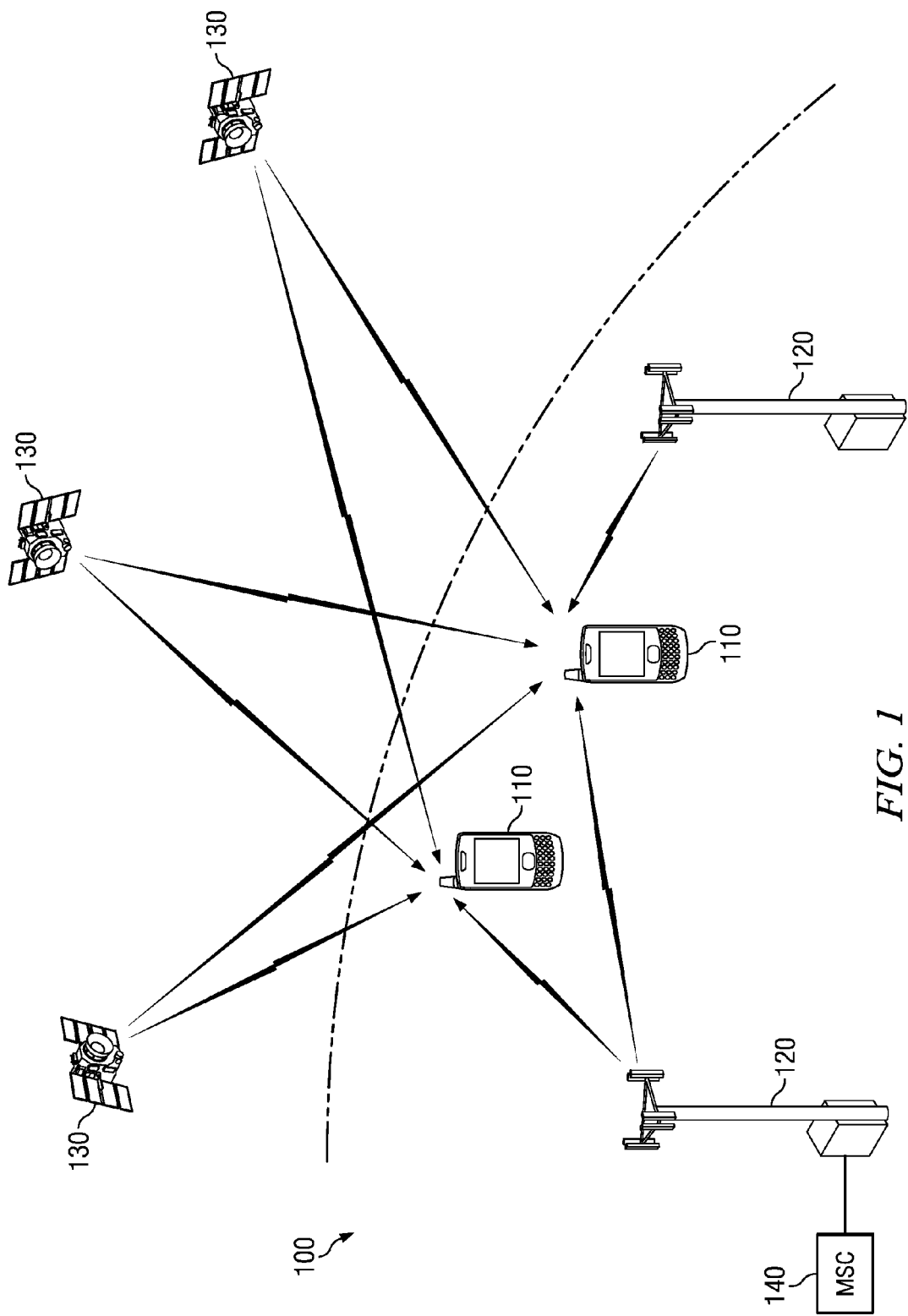
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
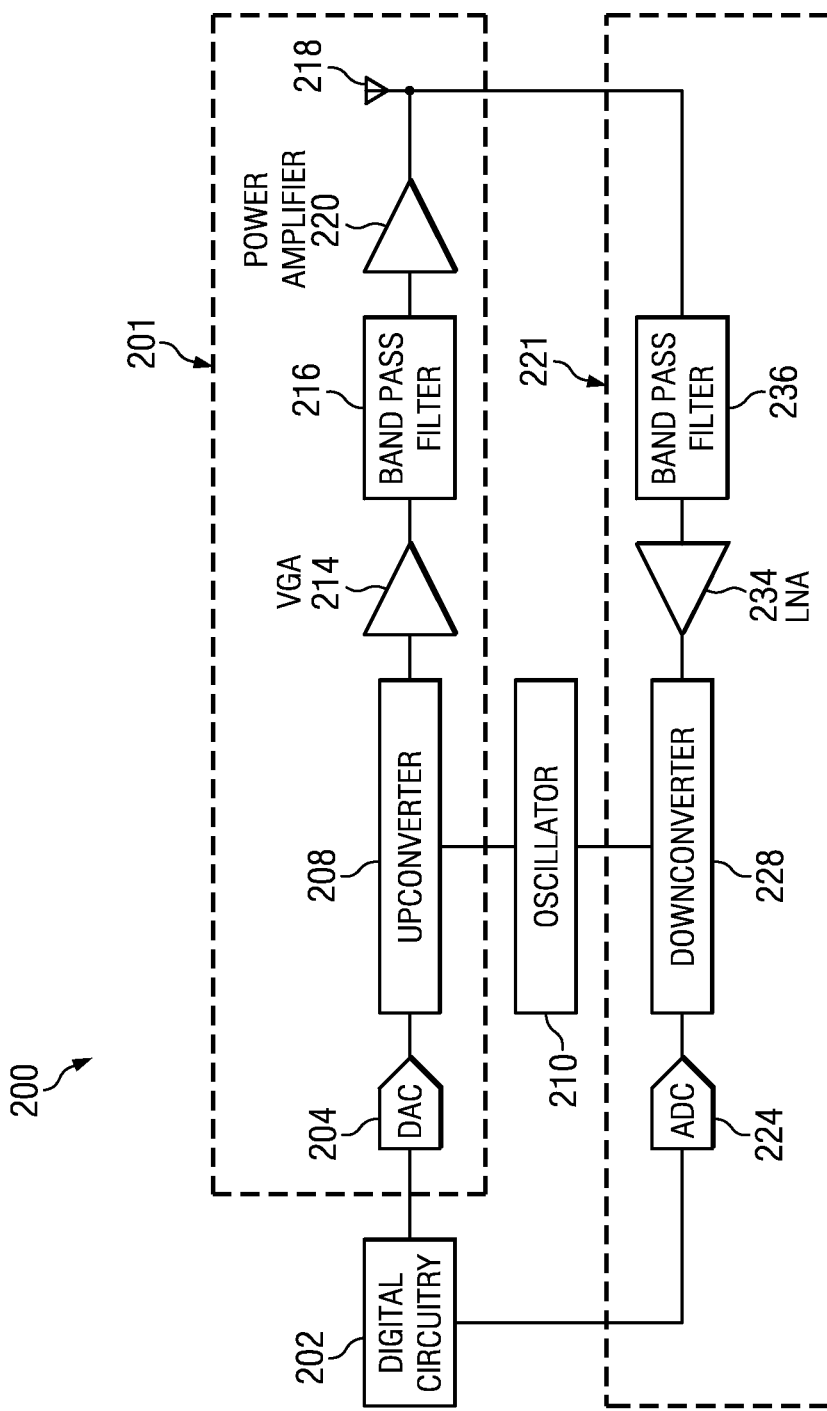
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver. In addition, in certain embodiments transmit path 201 may be considered a transmitter, while receive path 221 may be considered a receiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. In some embodiments, upconverter 208 may comprise a mixer. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 234 to amplify a signal received from bandpass filter 236. In some embodiments, LNA 234 may be implemented in whole or part by a broadband transconductance amplifier (TCA) (e.g., broadband TCA 300 depicted in FIG. 3 or broadband TCA 301 depicted in FIG. 6).

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). In some embodiments, downconverter 228 may comprise a mixer.

Receive path 221 may further include an analog-to-digital converter (ADC) 224 configured to receive the current-mode analog signal from downconverter 228 and convert such analog signal into a digital signal. Such digital signal may then be passed to digital circuitry 202 for processing.

Figure 3:
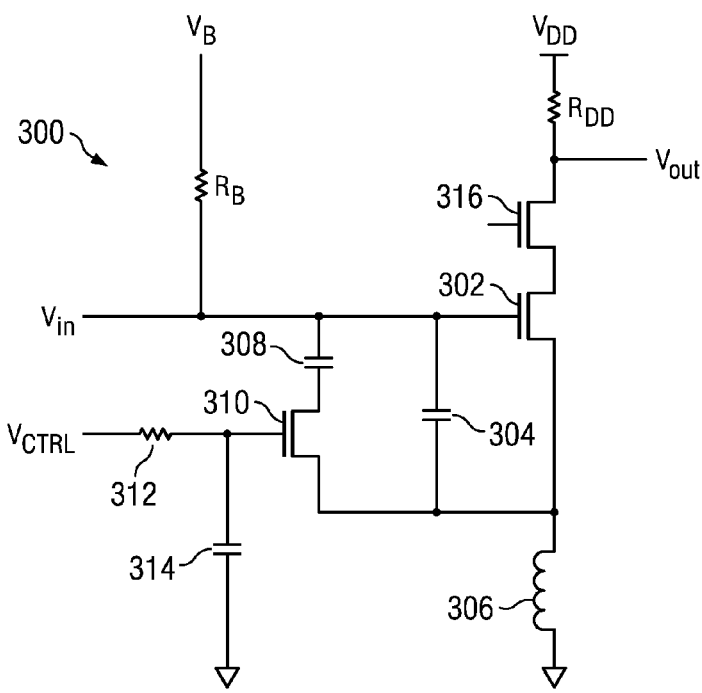
FIG. 3 illustrates a block diagram of an example broadband transconductance amplifier, in accordance with certain embodiments of the present disclosure.

FIG. 3 illustrates a block diagram of an example broadband trandconductance amplifier (TCA) 300, in accordance with certain embodiments of the present disclosure. As shown in FIG. 3, broadband TCA 300 may comprise transistors 302 and 316, non-switched capacitor 304, inductor 306, switched capacitor 308, switching transistor 310, control input resistor 312 and control input capacitor 314. As used herein, a transistor may comprise any system, device, or apparatus configured to switch and/or amplify electric signals. Transistors 302, 310, and 316 are depicted in the specific embodiment of FIG. 3 as n-type metal-oxide-semiconductor field-effect transistors, but may be implemented as any suitable transistor or switch. Additionally, as used herein, a resistor may comprise any electronic component that produces a voltage across its terminals that is proportional to the electric current passing through it in accordance with Ohm's law. Furthermore, as used herein, a capacitor may comprise any electronic component including a pair of conductors separated by a dielectric, such that when a potential difference exists across the conductors a static electric field develops in the dielectric that stores energy and produces a mechanical force between the conductors. Moreover, as used herein an inductor may comprise any system, device, or apparatus that stores energy in its magnetic field, induces a voltage due to a time-varying magnetic field in the inductor and opposes a change in current that induces the voltage.

As shown in FIG. 3, gain transistor 302 may be coupled at its gate terminal to the input of broadband TCA 300 such that an input signal $V_{in}$ of broadband TCA may be applied to the gate terminal. Furthermore, gain transistor 302 may be coupled at one of its non-gate terminals (e.g., a drain terminal) to the output of broadband TCA 300 via transistor 316, and coupled at the other of its non-gate terminals (e.g., a source terminal) to a terminal of inductor 306. In operation, gain transistor 302 may function to generate a current signal proportional to input signal $V_{in}$, and, accordingly, an output signal $V_{out}$ of broadband TCA 300 may be a function of such generated current signal, and consequently, a function of the input signal $V_{in}$.

Non-switched capacitor 304 may be coupled at one terminal to the input of broadband TCA 300 and the gate of gain transistor 302, and at its other terminal to inductor 306 and a non-gate terminal (e.g., the source terminal).

Switched capacitor 308 may be coupled at one terminal to the input of broadband TCA 300 and the gate of gain transistor 302, and at its other terminal to a non-gate terminal (e.g., a drain terminal) of switching transistor 310. Switching transistor 310 may be coupled at its gate terminal to a control signal input via a resistive-capacitive pair formed by control input resistor 312 and control input capacitor 314 such that a control signal $V_{CTRL}$ may be applied to the gate terminal. Furthermore, switching transistor 310 may be coupled at its other non-gate terminal (e.g., its source terminal) to inductor 306. In operation, switching transistor 310 may act a switch, either effectively coupling switched capacitor 308 to inductor 306 and the source terminal of switching transistor 310 (thus enabling capacitor 308), or leaving one terminal of switched capacitor 308 floating (thus disabling capacitor 308), depending on the control signal voltage $V_{CTRL}$ applied to the gate terminal of switching transistor 310 (e.g., a "high" voltage applied to the gate terminal of switching transistor 310 may close the switch of switching transistor 310 thus enabling switched capacitor 308, while a "low" voltage applied to the gate terminal of switching transistor 310 may open the switch of switching transistor 310 leaving a terminal of switched capacitor 308 floating).

Control input resistor 312 may be coupled between the control input of broadband TCA 300 and the gate terminal of switching transistor 310. Control input capacitor 314 may be coupled between the gate terminal of switching transistor 310 and a low-potential voltage supply (e.g., ground). Control input resistor 312 and control input capacitor 314 may form a resistive-capacitive pair that may enhance properties associated with a parasitic capacitance of switching transistor 310, as described in greater detail below.

Inductor 306 may be coupled between a non-gate terminal of gain transistor 302 (e.g., the source terminal) and a low-potential voltage supply (e.g., ground). In operation, inductor 306 may function to generate real input impedance to match the impedance of components coupled to the input of broadband TCA 300.

Transistor 316 may be coupled at one of its non-gate terminals (e.g., source terminal) to a non-gate terminal (e.g., drain terminal of gain transistor 302) and at its other non-gate terminal (e.g., drain terminal) to a source voltage $V_{DD}$. A resistor may be coupled between transistor 316 and the source voltage. Transistor 316 may be coupled at its gate terminal to a bias voltage source configured to bias the transistor in a saturation mode operation. In operation, transistor 316 may function to reduce interference between the input and the output of broadband TCA 300.

In operation, switched capacitance 308 may be selectively disabled or enabled by control input signal $V_{CTRL}$ and switching transistor 310 in order to manipulate the input impedance magnitude $R_P$ of broadband TCA 300 and a quality factor $(Q_{in})$ associated with the input impedance. To illustrate, an input impedance of broadband TCA 300 may be given by the equation:

$$Z_{in} = R_s + jX_s = g_m L_s / C_{gs} + j(\omega L_s - 1/\omega C_{gs})$$

where $Z_{in}$ is the input impedance, $R_s$ is the real impedance component of the input impedance, $X_s$ is the imaginary impedance component of the input impedance, j is $\sqrt{-1}$, $g_m$ is the transconductance gain of gain transistor 302, $L_s$ is the inductance of inductor 306, $C_{gs}$ is the equivalent capacitance between the gate terminal of gain transistor 302 and the source terminal of transistor 302, and $\omega$ is an angular frequency that is a function of the operating frequency of broadband TCA 300. In the embodiment depicted in FIG. 3, when switched capacitance 308 is enabled, $C_{gs}$ may approximately equal the sum of the capacitances of switched capacitor 308, non-switched capacitor 304, and the gate-to-source capacitance of transistor 302, and when switched capacitance 308 is disabled, $C_{gs}$ may approximately equal the sum of the capacitance of non-switched capacitor 304 and the gate-to-source capacitance of the 302 transistor.

Additionally, input impedance magnitude $R_P$ may be given by the equation:

$$R_P = (R_s^2 + X_s^2)/R_s$$

and quality factor $Q_{in}$ may be given by the equation:

$$Q_{in} = |X_s|/R_s$$

Accordingly, $C_{gs}$, and thus $R_P$ and $Q_{in}$ may be manipulated by selectively enabling switched capacitor 308 in order to maintain each of $R_P$ and $Q_{in}$ at relatively constant values over operating frequencies of broadband TCA 300, which may also reduce the dependence of the gain and the noise figure of broadband TCA 300 on operating frequency.

Figure 4:
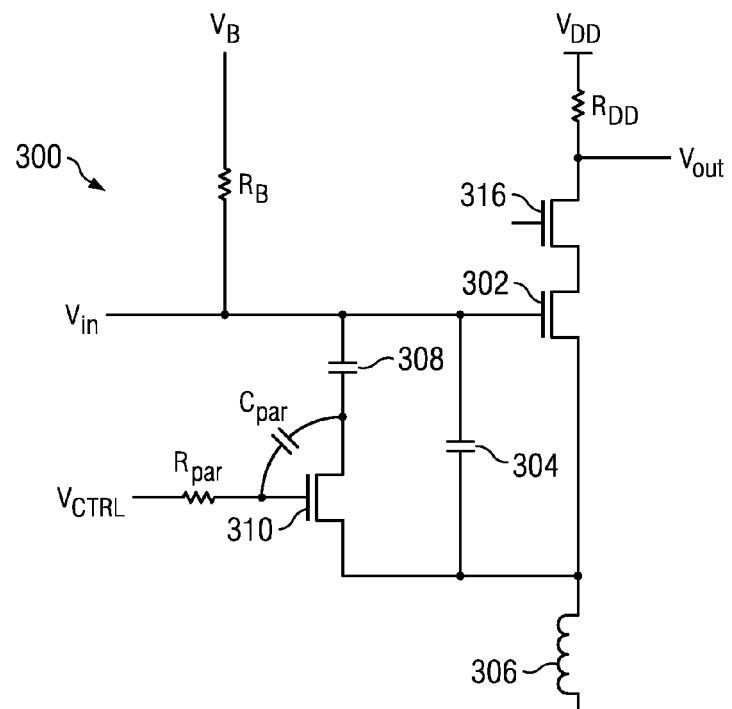
FIG. 4 illustrates example broadband transconductance amplifier of FIG. 3 without certain components.
Figure 5A:
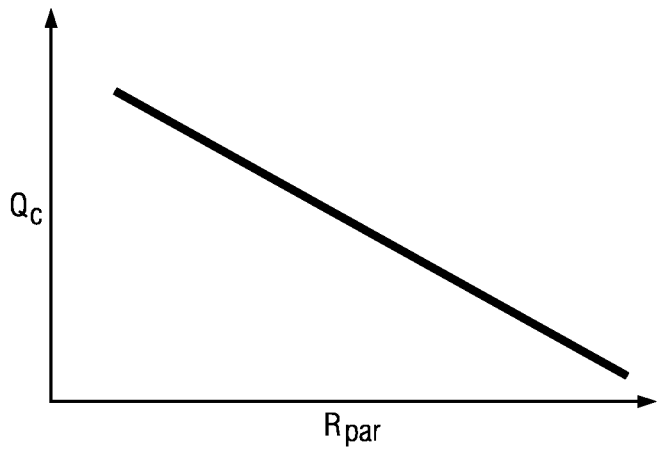
FIGS. 5A-5C illustrate example graphical data depicting potential advantages of a resistive-capacitive pair coupled to a control input of the example broadband transconductance amplifier of FIG. 3, in accordance with certain embodiments of the present disclosure.
Figure 5B:
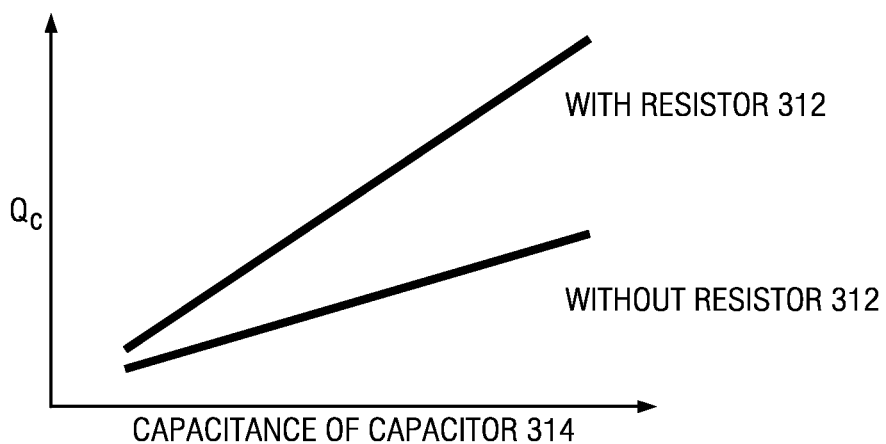
Figure 5C:
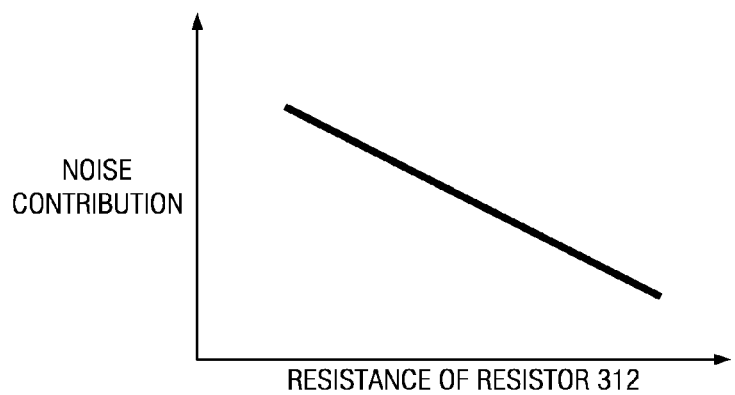

The enhanced properties that may be introduced by the resistive-capacitive pair formed by control input resistor 312 and control input capacitor 314 may be illustrated by referenced to FIGS. 4, 5A, 5B and 5C. FIG. 4 depicts broadband TCA 300 of FIG. 3 without control input resistor 312 and control input capacitor 314. As shown in FIG. 4, a parasitic resistance $R_{par}$ may be present at the gate of switching transistor 310, and a parasitic capacitance $C_{par}$ may be present between the drain terminal of switching transistor 310 and the gate terminal of switching transistor 310. As a result, the quality factor $Q_C$ of switched capacitor 308 may be relatively low, as shown in FIG. 5A, which depicts $Q_C$ versus $R_{par}$. The presence of control input capacitor 314 and control input resistor 312 may increase $Q_C$, as shown in FIG. 5B. In addition, the noise contribution of switched capacitor 310 may also be reduced with the presence of control input resistor 312, as shown in FIG. 5C.

Figure 6:
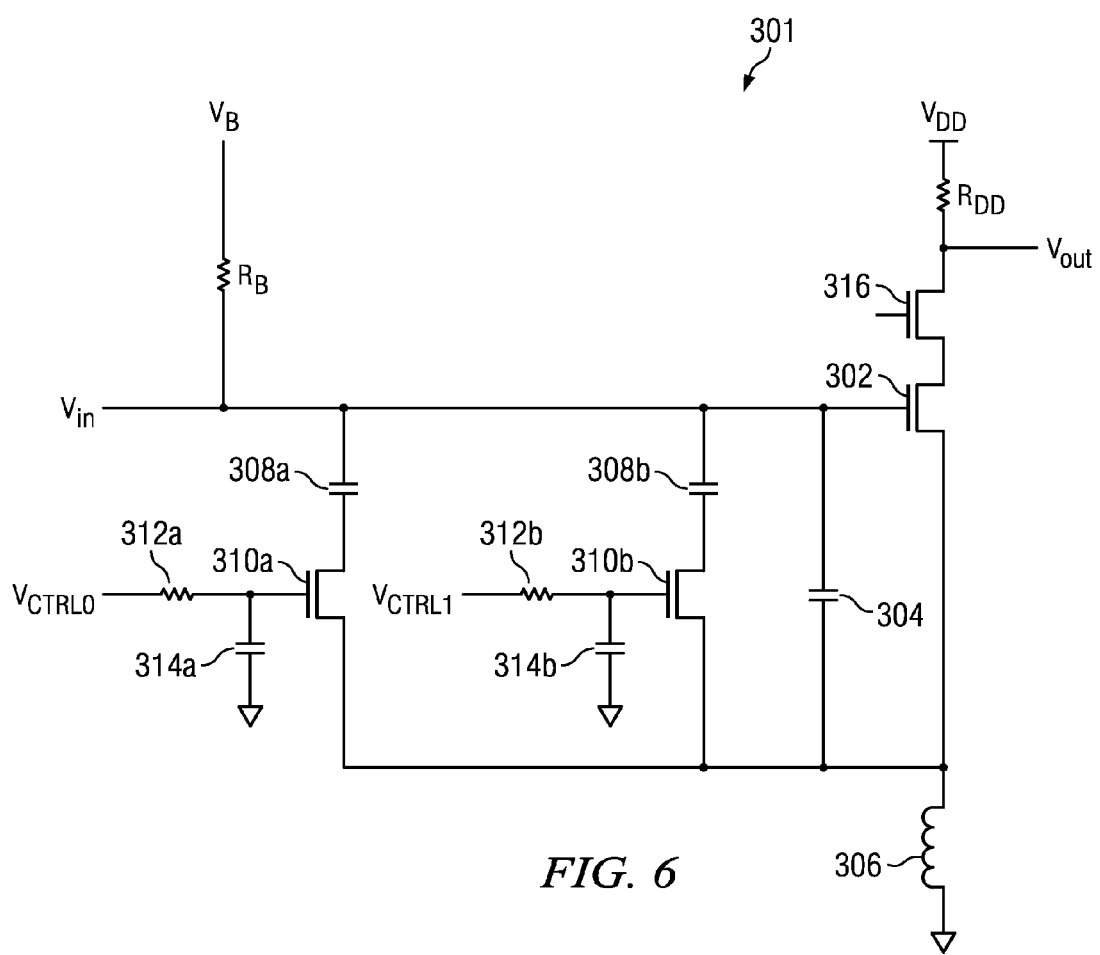
FIG. 6 illustrates a block diagram of an example broadband transconductance amplifier having multi-bit control, in accordance with certain embodiments of the present disclosure, in accordance with certain embodiments of the present disclosure.

Although FIG. 3 depicts broadband TCA 300 having a one-bit control controlling a single switched capacitor 308, embodiments of the present disclosure may include a broadband TCA with multi-bit control controlling multiple switched capacitors, thus allowing greater granularity in varying capacitance and/or widening an effective frequency range of operation of the broadband TCA. FIG. 6 depicts an example broadband TCA 301 similar in architecture to broadband TCA 300 but having two-bit control of switched capacitances 308, wherein each switched capacitance has a corresponding switching transistor 310 and corresponding resistive-capacitive pair comprising control input resistor 312 and control input capacitor 314.

Figure 7A:
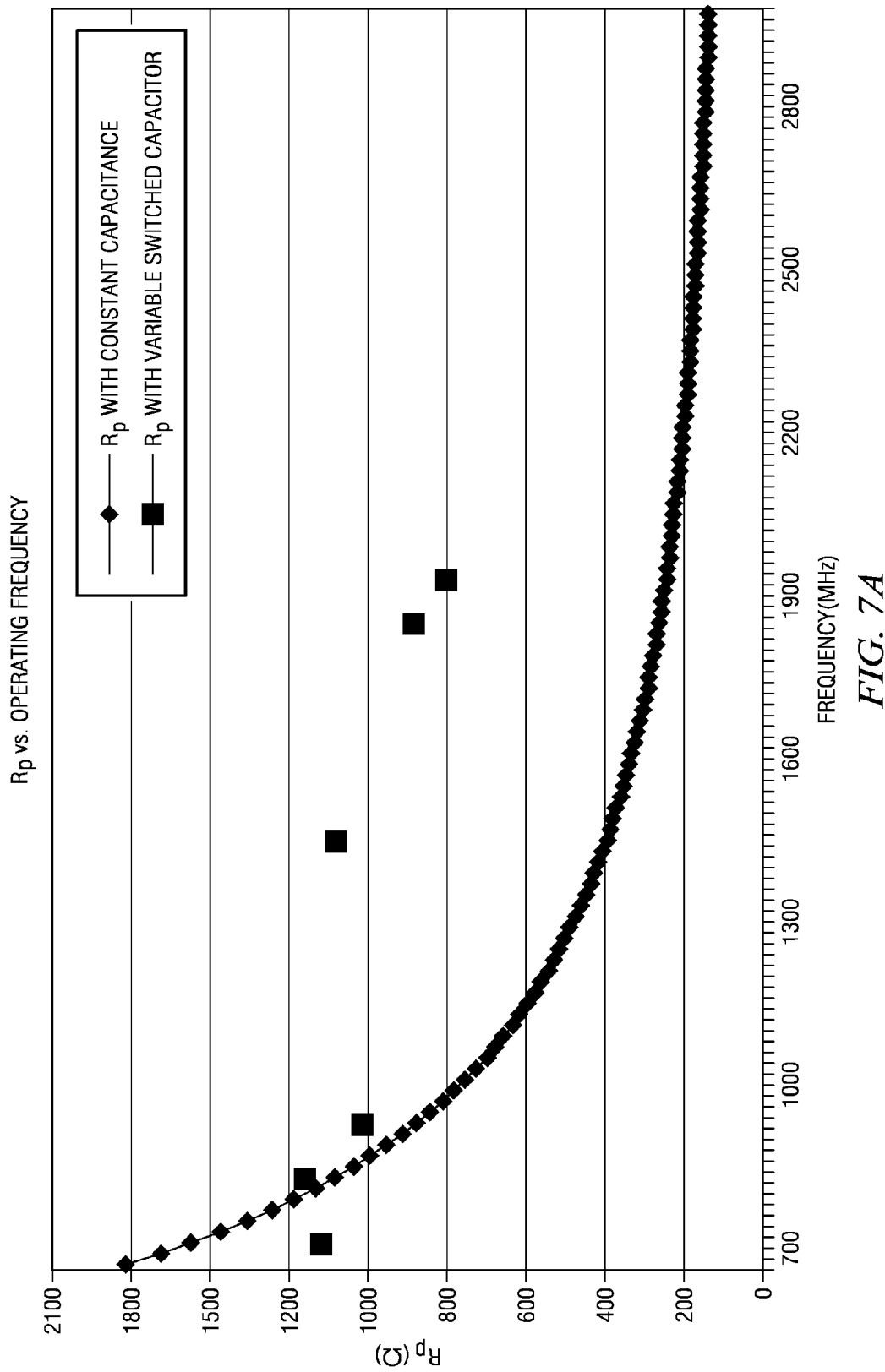
FIGS. 7A and 7B illustrate example graphical data depicting potential advantages of using a variable capacitance to manipulate quality factor and input impedance of a broadband transconductance amplifier, in accordance with certain embodiments of the present disclosure.
Figure 7B:
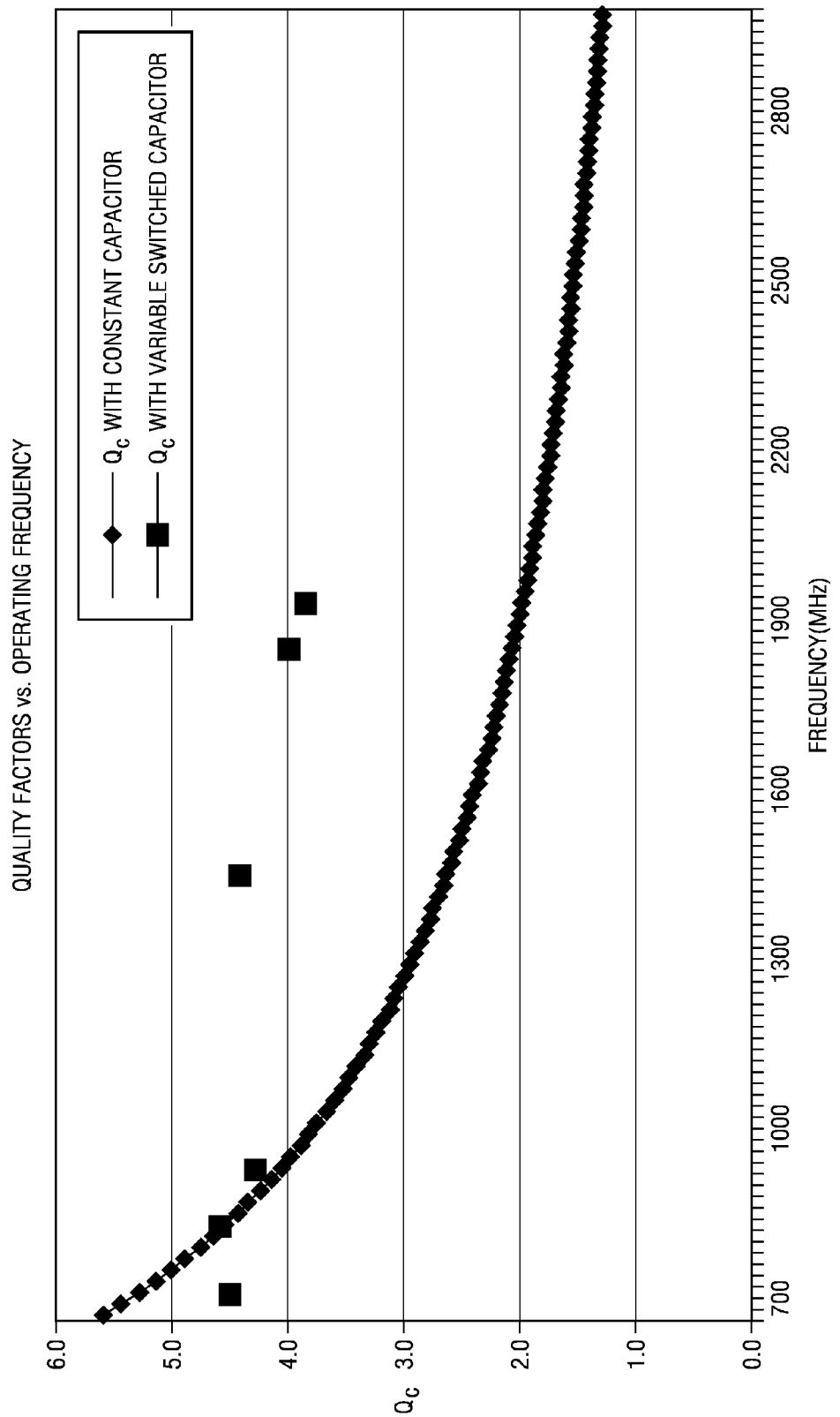

FIGS. 7A and 7B illustrate example graphical data depicting potential advantages of using a variable capacitance comprising one or more switched capacitors 308 as depicted in FIGS. 3 and 6 to manipulate an input impedance of a broadband TCA and quality factor associated therewith, in accordance with certain embodiments of the present disclosure. As shown in FIGS. 7A and 7B, input impedance magnitude $R_P$ of a broadband TCA (e.g., broadband TCA 300 and/or 301) and a quality factor $Q_{in}$ associated therewith may each decrease with increasing frequency in the present of a constant input capacitance, but may remain substantially constant where such input capacitance is varied over the range of operating frequencies.

Although FIGS. 3 and 6 depict switched capacitances 308 coupled to the gate terminal of gain transistor 302 and their corresponding switched transistors 310 coupled to the source terminal of gain transistor 302, in some embodiments the positioning of a switched capacitance 308 and its corresponding switching transistor 310 may be reversed, such that switched capacitor 310 is coupled via its drain terminal to the gate terminal of gain transistor 302 and switched capacitor 308 is coupled between the source terminal of switched capacitor 310 and the source terminal of gain transistor 302.

As used herein, a parasitic capacitance is a physical capacitance that is possessed by an electrical component but which it is not desirable or intended for it to have for its intended purpose. Similarly, a parasitic resistance is a physical resistance that is possessed by an electrical component but which it is not desirable or intended for it to have for its intended purpose. As used in this disclosure, including the claims appended hereto, references to a capacitance or a capacitor are intended to exclude capacitances that are solely parasitic capacitances, unless specific reference is made thereto to a parasitic capacitance. Similarly, as used in this disclosure, including the claims appended hereto, references to a resistance or a resistor are intended to exclude resistances that are solely parasitic resistances, unless specific reference is made thereto to a parasitic resistance.

Also, as used in this disclosure, including the claims appended hereto, references to particular terminals of a transistor are intended to generically apply to analogous terminals of different types of transistors, even though such terminals may not traditionally be identified in accordance with such references. For example, the term gate terminal may not only refer to a gate terminal of a metal-oxide-conductor field-effect transistor, but may also refer to a base terminal of a bipolar junction transistor or analogous terminal of another type of transistor. As another example, the term non-gate terminal may not only refer to a source terminal or drain terminal of a metal-oxide-conductor field-effect transistor, but may also refer to an emitter terminal or collector terminal of a bipolar junction transistor or analogous terminal of another type of transistor.

Modifications, additions, or omissions may be made to system 100 from the scope of the disclosure. The components of system 100 may be integrated or separated. Moreover, the operations of system 100 may be performed by more, fewer, or other components. As used in this document, "each" refers to each member of a set or each member of a subset of a set.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could me made hereto without departing from the spirit and scope of the invention.

What is claimed is:

1. A transconductance amplifier having an input terminal for receiving an input signal and an output terminal for communicating an output signal based on the input signal, the transconductance amplifier comprising:
   a gain transistor having a gate terminal, a first non-gate terminal, and a second non-gate terminal, the first non-gate terminal coupled to the output terminal of the transconductance amplifier; and
   a variable capacitance coupled between the gate terminal of the gain transistor and the second non-gate terminal of the gain transistor, the variable capacitance comprising:
      a non-switched capacitor coupled between the gate terminal of the gain transistor and the second non-gate terminal of the gain transistor;
      a switched capacitor having a first terminal and a second terminal; and
      a switching transistor having a gate terminal, a first non-gate terminal, and a second non-gate terminal, the first non-gate terminal coupled to the first terminal of the switched capacitor, and the gate terminal of the switching transistor coupled to a control terminal of the transconductance amplifier for receiving a control signal;
      wherein one of the second terminal of the switched capacitor and the second non-gate terminal of the switching transistor is coupled to the gate terminal of the gain transistor and the other of the second terminal of the switched capacitor and the second non-gate terminal of the switching transistor is coupled to the second-non gate terminal of the gain transistor.

2. The transconductance amplifier of claim 1, the gate of the switching transistor coupled to the control terminal via a resistive-capacitive circuit comprising a control input resistor and a control input capacitor.

3. The transconductance amplifier of claim 2, wherein:
   the control input resistor is coupled between the control terminal and the gate terminal of the switching transistor; and
   the control input resistor having a first terminal and a second terminal, the control input resistor coupled at its first terminal to the gate terminal of the switching transistor and configured to be coupled at its second terminal to a supply potential.

4. The transconductance amplifier of claim 1, the variable capacitance being based on an operating frequency of the transconductance amplifier.

5. The transconductance amplifier of claim 1, the gain transistor comprising an n-type metal-oxide-semiconductor field-effect transistor.

6. The transconductance amplifier of claim 1, wherein the first non-gate terminal of the gain transistor is coupled to the output terminal of the transconductance amplifier via another transistor.

7. The transconductance amplifier of claim 1, further comprising an inductor having a first terminal and a second terminal, the inductor coupled at its first terminal to the second non-gate terminal of the switching transistor and configured to be coupled at its second terminal to a supply potential.

8. The transconductance amplifier of claim 1, wherein:
   the switched capacitor is one of a plurality of switched capacitors, each of the plurality of switched capacitors having a first terminal and a second terminal; and
   the switched transistor is one of a plurality of switching transistors, each of the plurality of switching transistors having a gate terminal, a first non-gate terminal, and a second non-gate terminal, each particular first non-gate terminal coupled to the first terminal of an associated switched capacitor of the plurality of switched capacitors, and the gate terminal of the particular switching transistor coupled to a control terminal of the transconductance amplifier for receiving a control signal;
   one of the second terminal of the associated switched capacitor and the second non-gate terminal of the particular switching transistor is coupled to the gate terminal of the gain transistor and the other of the second terminal of the associated switched capacitor and the second non-gate terminal of the particular switching transistor is coupled to the second-non gate terminal of the gain transistor.

9. A wireless communication element, comprising:
   a transmit path configured to convert a first digital signal into a first modulated wireless communication signal and transmit the first modulated wireless communication signal; and
   a receive path configured to receive a second modulated wireless communication signal and convert the second wireless communication signal into a second digital signal, the receive path comprising a transconductance amplifier having an input terminal for receiving an input signal and an output terminal for communicating an output signal based on the input signal, the transconductance amplifier comprising:
- a gain transistor having a gate terminal, a first non-gate terminal, and a second non-gate terminal, the first non-gate terminal coupled to the output terminal of the transconductance amplifier; and
- a variable capacitance coupled between the gate terminal of the gain transistor and the second non-gate terminal of the gain transistor, the variable capacitance comprising:
  - a non-switched capacitor coupled between the gate terminal of the gain transistor and the second non-gate terminal of the gain transistor;
  - a switched capacitor having a first terminal and a second terminal; and
  - a switching transistor having a gate terminal, a first non-gate terminal, and a second non-gate terminal, the first non-gate terminal coupled to the first terminal of the switched capacitor, and the gate terminal of the switching transistor coupled to a control terminal of the transconductance amplifier for receiving a control signal;
  - wherein one of the second terminal of the switched capacitor and the second non-gate terminal of the switching transistor is coupled to the gate terminal of the gain transistor and the other of the second terminal of the switched capacitor and the second non-gate terminal of the switching transistor is coupled to the second-non gate terminal of the gain transistor.

10. The wireless communication element of claim 9, the gate of the switching transistor coupled to the control terminal via a resistive-capacitive circuit comprising a control input resistor and a control input capacitor.

11. The wireless communication element of claim 10, wherein:
- the control input resistor is coupled between the control terminal and the gate terminal of the switching transistor; and
- the control input resistor having a first terminal and a second terminal, the control input resistor coupled at its first terminal to the gate terminal of the switching transistor and configured to be coupled at its second terminal to a supply potential.

12. The wireless communication element of claim 9, the variable capacitance based on an operating frequency of the transconductance amplifier.

13. The wireless communication element of claim 9, wherein the first non-gate terminal of the gain transistor is coupled to the output terminal of the transconductance amplifier via another transistor.

14. The wireless communication element of claim 9, the transconductance amplifier further comprising an inductor having a first terminal and a second terminal, the inductor coupled at its first terminal to the second non-gate terminal of the switching gain transistor and configured to be coupled at its second terminal to a supply potential.

15. The wireless communication element of claim 9, wherein:
the switched capacitor is one of a plurality of switched capacitors, each of the plurality of switched capacitors having a first terminal and a second terminal; and
the switched transistor is one of a plurality of switching transistors, each of the plurality of switching transistors having a gate terminal, a first non-gate terminal, and a second non-gate terminal, each particular first non-gate terminal coupled to the first terminal of an associated switched capacitor of the plurality of switched capacitors, and the gate terminal of the particular switching transistor coupled to a control terminal of the transconductance amplifier for receiving a control signal;
one of the second terminal of the associated switched capacitor and the second non-gate terminal of the particular switching transistor is coupled to the gate terminal of the gain transistor and the other of the second terminal of the associated switched capacitor and the second non-gate terminal of the particular switching transistor is coupled to the second-non gate terminal of the gain transistor.

16. A method comprising:
determining an operating frequency of a transconductance amplifier comprising:
- a gain transistor having a gate terminal coupled to an input terminal of the transconductance amplifier, a first non-gate terminal, and a second non-gate terminal; and
- a variable capacitance coupled between the gate terminal of the gain transistor and the first non-gate terminal of the gain transistor; and
selecting a capacitance of the variable capacitance based on the operating frequency such that at least one of a magnitude of the input impedance of the input terminal of the transconductance amplifier and a quality factor associated with the input impedance remains substantially constant over a plurality of operating frequencies of the transconductance amplifier;
wherein the variable capacitance comprises:
- a switched capacitor having a first terminal and a second terminal; and
- a switching transistor having a gate terminal, a first non-gate terminal, and a second non-gate terminal, the first non-gate terminal coupled to the first terminal of the switched capacitor, and the gate terminal of the switching transistor coupled to a control terminal of the transconductance amplifier for receiving a control signal;
wherein one of the second terminal of the switched capacitor and the second non-gate terminal of the switching transistor is coupled to the gate terminal of the gain transistor and the other of the second terminal of the switched capacitor and the second non-gate terminal of the switching transistor is coupled to the first-non gate terminal of the gain transistor; and
selecting the capacitance of the variable capacitance comprises selectively enabling or disabling the switched capacitor based on the operating frequency.

17. A method according to claim 16, wherein selecting the capacitance of the variable capacitance comprises generating the control signal based on the operating frequency.

* * * * *